US009627059B2

(12) United States Patent
Lin et al.

(10) Patent No.: US 9,627,059 B2
(45) Date of Patent: Apr. 18, 2017

(54) RESISTIVE MEMORY AND DATA WRITING METHOD FOR MEMORY CELL THEREOF

(71) Applicant: Winbond Electronics Corp., Taichung (TW)

(72) Inventors: Lih-Wei Lin, Taichung (TW); I-Hsien Tseng, Taichung (TW); Ju-Chieh Cheng, Taichung (TW); Chia-Hung Lin, Taichung (TW); Tsung-Huan Tsai, Taichung (TW); Po-Wei Huang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/977,667

(22) Filed: Dec. 22, 2015

(65) Prior Publication Data

US 2016/0276027 A1 Sep. 22, 2016

(30) Foreign Application Priority Data

Mar. 20, 2015 (TW) .............................. 104108986 A

(51) Int. Cl.
*G11C 11/00* (2006.01)
*G11C 13/00* (2006.01)

(52) U.S. Cl.
CPC ........ *G11C 13/0069* (2013.01); *G11C 13/004* (2013.01); *G11C 13/0097* (2013.01); *G11C 13/0026* (2013.01); *G11C 13/0028* (2013.01); *G11C 13/0064* (2013.01); *G11C 2013/0078* (2013.01); *G11C 2013/0083* (2013.01); *G11C 2213/79* (2013.01); *G11C 2213/82* (2013.01)

(58) Field of Classification Search
CPC .............. G11C 13/0069; G11C 13/004; G11C 13/0097; G11C 13/0026; G11C 13/0028
See application file for complete search history.

(56) References Cited

U.S. PATENT DOCUMENTS

| 2010/0110763 | A1 | 5/2010 | Li et al. |
| 2010/0271861 | A1 | 10/2010 | Kitagawa |
| 2012/0081946 | A1* | 4/2012 | Kawabata ........... G11C 11/5685 365/148 |
| 2012/0147655 | A1* | 6/2012 | Lee .......................... G11C 8/14 365/148 |

(Continued)

FOREIGN PATENT DOCUMENTS

| JP | 2010079977 | 4/2010 |
| TW | 201329981 | 7/2013 |
| TW | 201505219 | 2/2015 |

OTHER PUBLICATIONS

"Office Action of Taiwan Counterpart Application", issued on Jul. 22, 2016, p. 1-p. 9, in which the listed references were cited.

*Primary Examiner* — Toan Le
(74) *Attorney, Agent, or Firm* — Jianq Chyun IP Office

(57) ABSTRACT

A resistive memory and a data writing method for a resistive memory cell thereof are provided. The method includes: receiving and decoding a column address signal for generating a decoded result, and providing a word line voltage to a word line of the resistive memory cell; providing a constant current to one of a bit line and a source line of the resistive memory cell, and coupling a reference ground voltage to another one of the bit line and the source line of the resistive memory cell.

8 Claims, 2 Drawing Sheets

(56) References Cited

U.S. PATENT DOCUMENTS

| | | | |
|---|---|---|---|
| 2012/0257437 A1* | 10/2012 | Seko | G11C 11/5678 |
| | | | 365/148 |
| 2013/0028010 A1* | 1/2013 | Li | G11C 11/16 |
| | | | 365/158 |
| 2013/0070517 A1 | 3/2013 | Sonehara et al. | |
| 2013/0301335 A1* | 11/2013 | Ong | G11C 29/06 |
| | | | 365/148 |
| 2013/0337628 A1 | 12/2013 | Sonehara | |
| 2014/0286080 A1 | 9/2014 | Takahashi et al. | |

* cited by examiner

RESISTIVE MEMORY AND DATA WRITING METHOD FOR MEMORY CELL THEREOF

CROSS-REFERENCE TO RELATED APPLICATION

This application claims the priority benefit of Taiwan application serial no. 104108986, filed on Mar. 20, 2015. The entirety of the above-mentioned patent application is hereby incorporated by reference herein and made a part of this specification.

BACKGROUND OF THE INVENTION

Field of the Invention

The invention relates to a resistive memory, and particularly relates to a data writing method of a resistive memory.

Description of Related Art

In a resistive memory, a forming operation is performed to generate conductive filament (CF), and the operation of generating the conductive filament greatly influences the operation of the resistive memory. Moreover, when a data logic 0 is to be written into a resistive memory cell, it can be implemented by performing a resetting operation on the resistive memory cell, and when a data logic 1 is to be written into the resistive memory cell, it can be implemented by performing a setting operation on the resistive memory cell. To write the data logic 0 or the data logic 1 to the resistive memory cell greatly influences a data retention and a data endurance.

In the prior art, the forming, resetting and setting operations performed on the resistive memory cell are generally implemented by exerting a set of fixed voltages to the resistive memory cells. Regarding the resistive memory cell completing a write operation, read currents obtained by reading the data logic 0 and the data logic 1 are expected to have a certain proportion when a read operation is performed. Therefore, a read margin of the resistive memory cell can be effectively increased by increasing the proportion of the read currents, which avails improving a high temperature data retention (HTDR) of the resistive memory.

SUMMARY OF THE INVENTION

The invention is directed to a resistive memory and a data writing method for a memory cell thereof, by which a current ratio in a read operation is effectively enhanced, so as to improve the performance of the resistive memory.

The invention provides a data writing method for a resistive memory cell, which includes following steps. A column address signal is received and decoded to generate a decoded result, and a word line voltage is provided to a word line of the resistive memory cell according to the decoded result. A constant current is provided to one of a bit line and a source line of the resistive memory cell, and a reference ground voltage is coupled to another one of the bit line and the source line of the resistive memory cell.

The invention provides a resistive memory including a plurality of resistive memory cells, a word line signal providing circuit, a bit line signal providing circuit and a source line signal providing circuit. The word line signal providing circuit is coupled to word lines of the resistive memory cells, and provides a word line voltage according to a column address signal to the word line of the selected resistive memory cell corresponding to the column address signal. The bit line signal providing circuit is coupled to bit lines of the resistive memory cells, and provides a reference ground voltage or a constant current source to the bit line of the selected resistive memory cell according to a row address signal. The source line signal providing circuit is coupled to source lines of the resistive memory cells, and provides the reference ground voltage or the constant current source to the source lines of the resistive memory cells.

According to the above descriptions, by providing a constant current source to perform a forming, setting or resetting operation to the resistive memory cell, a resistance changing trend of the resistive memory cell is effectively strengthened, and a read boundary of the resistive memory cell is enlarged. Under such condition, a high temperature data retention (HTDR) of the resistive memory cell is enhanced, and a distribution status of memory cell tailing in the resistive memory cell is greatly ameliorated, so as to improve the performance of the resistive memory.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
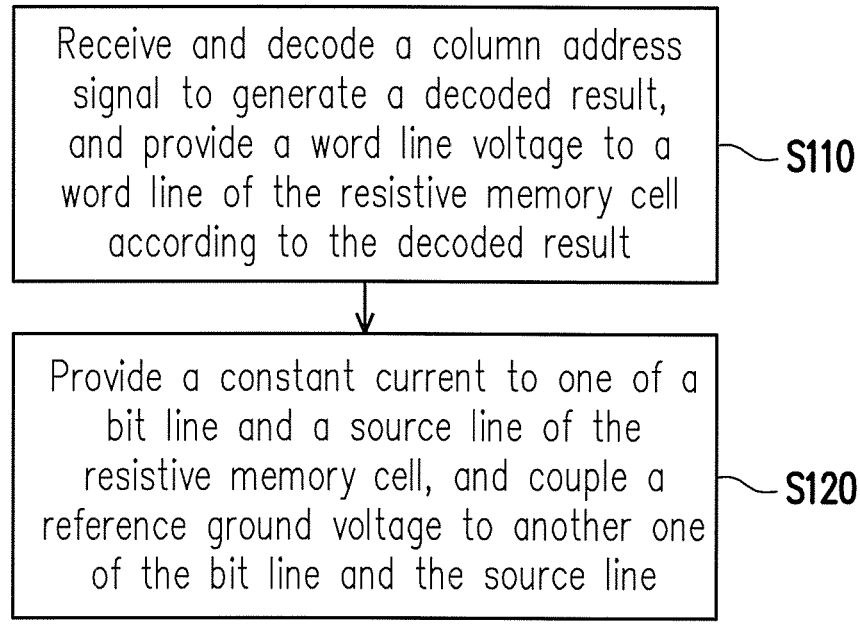
FIG. 1 is a flowchart illustrating a data writing method of a resistive memory cell according to an embodiment of the invention.

Referring to FIG. 1, FIG. 1 is a flowchart illustrating a data writing method of a resistive memory cell according to an embodiment of the invention. According to the method, in step S110, a column address signal is received and decoded to generate a decoded result, and a word line voltage is provided to a word line of the resistive memory cell according to the decoded result. Here, by decoding the column address signal, a column address of the resistive memory cell intended to implement a write operation can be obtained. In this way, the word line voltage is provided to the word line corresponding to the column address of the resistive memory cell intended to implement the write operation, so as to turn on a transistor in the resistive memory cell.

In step S120, a row address signal is received and decoded to obtain a row address of the resistive memory cell intended to implement the write operation. Meanwhile, a constant current is provided to one of a bit line and a source line of the resistive memory cell intended to implement the write operation. Meanwhile, a reference ground voltage is coupled to another one of the bit line and the source line of the resistive memory cell intended to implement the write operation.

To be specific, when a forming or setting operation is to be performed on the resistive memory cell, the constant current can be provided to the bit line of the selected resistive memory cell intended to implement the fanning or setting operation, and the source line of the selected resistive memory cell is coupled to the reference ground voltage. A voltage value of the reference ground voltage can be 0V. In this way, the constant current flows from the bit line to the resistive memory cell and flows to the source line, so as to perform the forming or setting operation to the resistive memory cell.

When a resetting operation is to be performed on the resistive memory cell, the constant current can be provided to the source line of the selected resistive memory cell intended to implement the resetting operation, and the bit line of the selected resistive memory cell is coupled to the reference ground voltage. In this way, the constant current flows from the source line to the resistive memory cell and flows to the bit line, so as to perform the resetting operation to the resistive memory cell.

It should be noted that the operation of providing the constant current to one of the bit line and the source line of the resistive memory cell intended to implement the write operation, and coupling the reference ground voltage to another one of the bit line and the source line of the resistive memory cell intended to implement the write operation can be performed in a first time interval. Moreover, after the first time interval is ended, providing of the constant current to the resistive memory cell is stopped, and in a subsequent second time interval, the source line is coupled to the reference ground voltage, and a read voltage is provided to the bit line of the resistive memory cell to perform a read operation of a resistance value of the resistive memory cell.

In the second time interval, a read current is produced on the bit line of the resistive memory cell by providing the read voltage to the bit line of the resistive memory cell and coupling the reference ground voltage to the source line, and the resistance value of the resistive memory cell is obtained by determining a current magnitude of the read current. Then, it is determined whether the resistance value of the resistive memory cell falls within a predetermined range, and when the resistance value of the resistive memory cell falls within the predetermined range, it represents that the forming, setting or resetting operation performed on the resistive memory cell is completed. Comparatively, when the resistance value of the resistive memory cell does not fall within the predetermined range, it represents that the forming, setting or resetting operation performed on the resistive memory cell is not completed.

When it is detected that the forming, setting or resetting operation performed on the resistive memory cell is not completed, the aforementioned operation of providing the constant current to one of the bit line and the source line of the resistive memory cell intended to implement the write operation, and meanwhile coupling the reference ground voltage to another one of the bit line and the source line of the resistive memory cell intended to implement the write operation are repeated, so as to again perform the forming, setting or resetting operation to the resistive memory cell.

Figure 2:
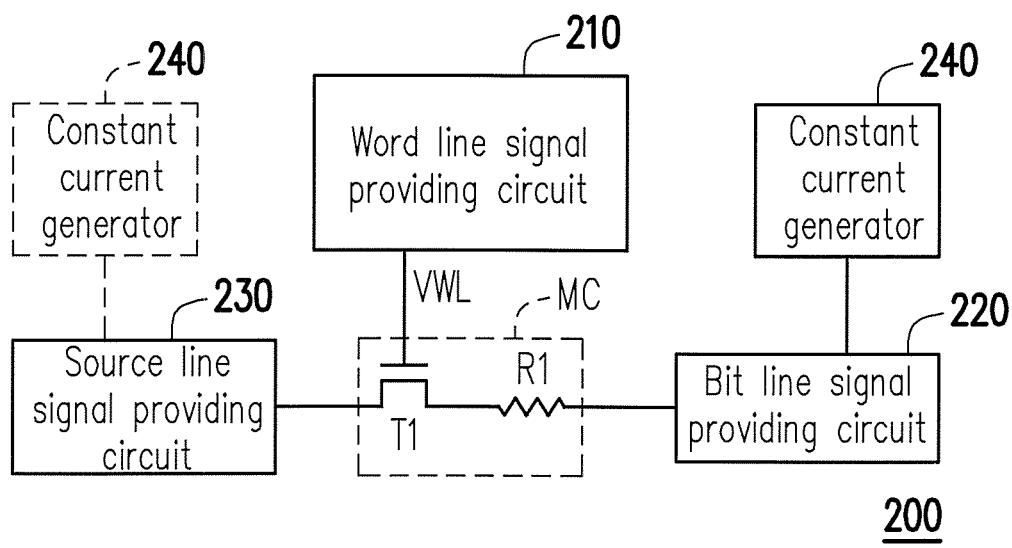
FIG. 2 is a schematic diagram of a resistive memory according to an embodiment of the invention.

Referring to FIG. 2, a resistive memory 200 includes a resistive memory cell MC, a word line signal providing circuit 210, a bit line signal providing circuit 220, a source line signal providing circuit 230 and a constant current generator 240. In the present embodiment, the resistive memory cell MC includes a transistor T1 and a resistor R1. The word line signal providing circuit 210 is coupled to a control terminal of the transistor T1 in the resistive memory cell MC. The bit line signal providing circuit 220 is coupled to a bit line of the resistive memory cell MC. The source line signal providing circuit 230 is coupled to a source line of the resistive memory cell MC. The constant current generator 240 is coupled to the bit line signal providing circuit 220 or the source line signal providing circuit 230 or coupled to both of the bit line signal providing circuit 220 and the source line signal providing circuit 230.

The word line signal providing circuit 210 can provide a word line voltage VWL according to a column address signal to the word line of the selected resistive memory cell MC corresponding to the column address signal.

The bit line signal providing circuit 220 is coupled to the bit line of the resistive memory cell MC, and provides a reference ground voltage or a constant current source to the bit line of the selected resistive memory cell MC according to a row address signal. The source line signal providing circuit 230 is coupled to the source line of the resistive memory cell MC, and provides the reference ground voltage or the constant current source to the source line of the resistive memory cell MC. To be specific, when the setting or forming operation is performed on the resistive memory cell MC, the source line signal providing circuit 230 provides the reference ground voltage to the source line of the resistive memory cell MC, and the bit line signal providing circuit 220 provides the constant current to the bit line of the resistive memory cell MC. Comparatively, when the resetting operation is performed on the resistive memory cell MC, the source line signal providing circuit 230 provides the constant current to the source line of the resistive memory cell MC, and the bit line signal providing circuit 220 provides the reference ground voltage to the bit line of the resistive memory cell MC.

It should be noticed that the resistive memory cell MC of the present embodiment includes the transistor T1 and the resistor R1, i.e. the so-called 1T1R resistive memory cell. However, the resistive memory cell applied to the embodiment of the invention is not limited to the 1T1R resistive memory cell, and other resistive memory cells known by those skilled in the art can also be applied, for example, a conventional 2T2R (two transistors and two resistors) resistive memory cell.

Moreover, as known by those skilled in the art, the memory may include a plurality of memory cells. Namely, the resistive memory 200 may include a plurality of other resistive memory cells. In FIG. 2, only the selected resistive memory cell MC is illustrated to explain the write operation thereof, so as to clearly introduce the operation of the embodiment to those skilled in the art.

Figure 3A:
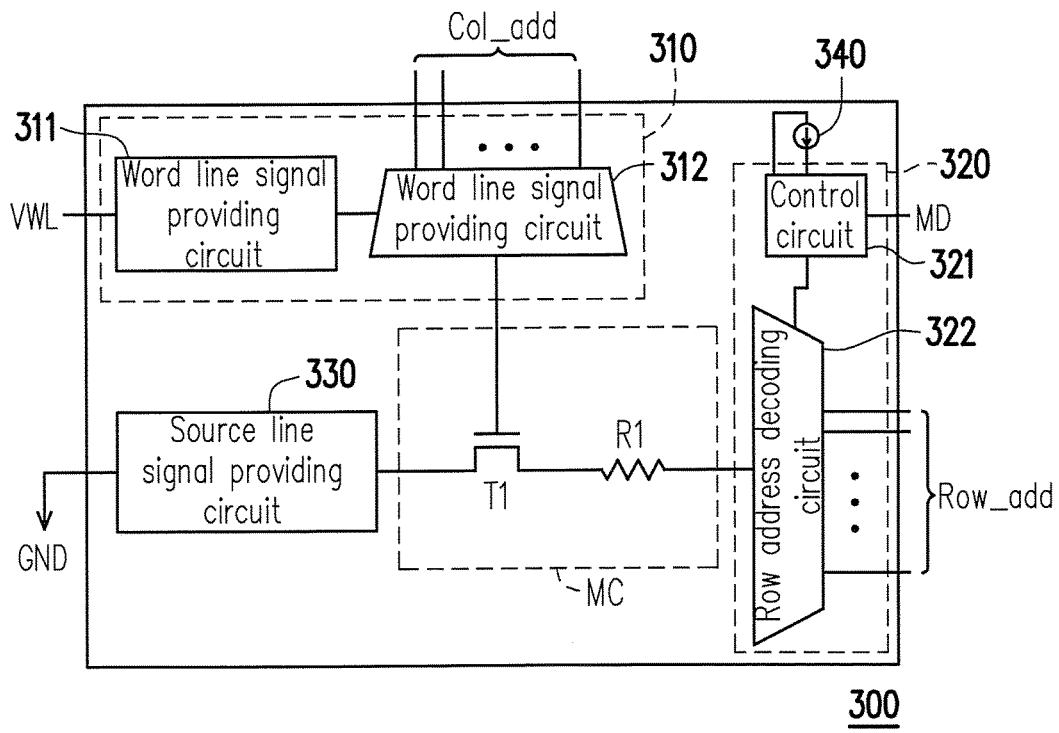
FIG. 3A is a schematic diagram of a resistive memory according to another embodiment of the invention.

FIG. 3A is an equivalent circuit schematic diagram of a resistive memory according to an embodiment of the invention. The resistive memory 300 includes a resistive memory cell MC, a word line signal providing circuit 310, a bit line signal providing circuit 320, a source line signal providing circuit 330 and a constant current generator 340. The resistive memory cell MC includes a transistor T1 and a resistor R1. The word line signal providing circuit 310 is coupled a control terminal of the transistor T1 in the resistive memory cell MC. The bit line signal providing circuit 320 is coupled to a bit line of the resistive memory cell MC. The source line signal providing circuit 330 is coupled to a source line of the resistive memory cell MC. The constant current generator 340 is coupled to the bit line signal providing circuit 320.

The word line signal providing circuit 310 includes a word line voltage control circuit 311 and a column address decoder 312. The word line voltage control circuit 311 receives a word line voltage VWL and provides the word line voltage VWL to the column address decoder 312. The column address decoder 312 is coupled to the word line voltage control circuit 311. The column address decoder 312 decodes a column address signal Col_add and provides the word line voltage VWL to the word line (i.e. the control terminal of the transistor T1) of the resistive memory cell MC according to a decoded result.

The bit line signal providing circuit 320 includes a control circuit 321 and a row address decoder 322. The control circuit 321 is coupled to the constant current generator 340 for receiving a constant current, where the control circuit 321 provides the constant current to the row address decoder 322 according to an operation mode signal MD. The operation mode signal MD is used for indicating whether the forming operation or the setting operation is performed on the resistive memory cell MC. The row address decoder 322 is coupled to the control circuit 321, and decodes a row address signal Row_add to generate a decoded result. Moreover, the row address decoder 322 provides the constant current to the bit line of the resistive memory cell MC according to the obtained decoded result. On the other hand, the source line signal providing circuit 330 provides the reference ground voltage GND to the source line of the resistive memory cell MC. In this way, the constant current can flow through the resistor R1 of the resistive memory cell MC, so as to perform the forming or setting operation to the resistive memory cell MC.

It should be noted that the aforementioned setting or forming operation can be performed in one first time interval, and in the first time interval, the constant current can be continuously applied to the bit line of the resistive memory cell MC, and continuously flows through the resistive memory cell MC. After the first time interval, the constant current is stopped to be applied to the bit line of the resistive memory cell MC, and an authentication operation of a next stage is performed, and if it is discovered that the setting or fanning operation of the resistive memory cell MC is not completed according to the authentication operation, a next setting or forming operation can be started.

It should be noticed that the constant current generator 240 can be set inside the resistive memory 200 or set outside the resistive memory 200. In brief, the constant current generator 240 can be embedded in the chip of the resistive memory 200, or can be set in a test platform, and when the resetting, setting, or forming operation of the resistive memory 200 is performed, the constant current generator 240 set in the test platform can be used to provide a constant current.

Figure 3B:
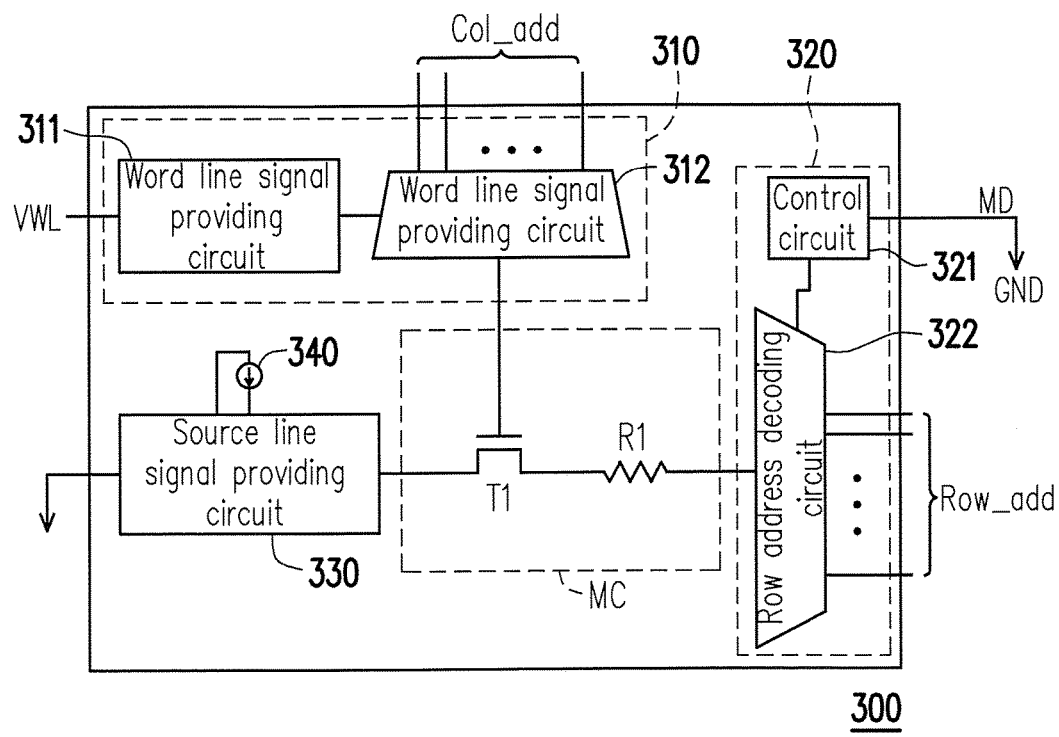
FIG. 3B is a schematic diagram of another implementation of a resistive memory according to an embodiment of the invention.

Regarding the resetting operation of the resistive memory cell MC, FIG. 3B is an equivalent circuit schematic diagram of another implementation of a resistive memory according to an embodiment of the invention. In FIG. 3B, the constant current generator 340 is coupled to the source line signal providing circuit 330. Moreover, the operation mode signal MD indicates that the resetting operation is performed on the resistive memory cell MC. The control circuit 321 provides the reference ground voltage GND according to the operation mode signal MD, and provides the reference ground voltage GND to the bit line of the resistive memory cell MC through the row address decoder 322. Moreover, the source line signal providing circuit 330 provides the constant current generated by the constant current generating circuit 340 to the source line of the resistive memory cell MC, and the resistive memory cell MC executes the resetting operation.

In summary, in the embodiments of the invention, the constant current is provided to the resistive memory cell to implement the data writing operation such as setting, resetting or forming operation of the resistive memory cell. In this way, the current flowing through the resistive memory cell is not changed along with a variation of the resistance value of the resistive memory cell, so as to maintain a stable write efficiency. Moreover, based on the constant current method, the setting operation performed on the resistive memory cell can be more efficient, and the read current generated by the resistive memory cell after the setting operation can be effectively increased, so as to enlarge a read boundary of the resistive memory cell, which avails enhancing a high temperature data retention (HTDR) of the resistive memory. Certainly, based on the constant current method, the efficiency of the resetting operation of the resistive memory is also improved, and a distribution status of memory cell tailing is ameliorated. Therefore, according to the embodiments of the invention, a whole performance of the resistive memory is effectively improved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A data writing method for a resistive memory cell, comprising:

receiving and decoding a column address signal to generate a decoded result, and providing a word line voltage to a word line of the resistive memory cell according to the decoded result;

providing a constant current generated by a constant current generator to a bit line of the resistive memory cell, and coupling a reference ground voltage to a source line of the resistive memory cell when a forming or setting operation being performed on the resistive memory cell; and providing the constant current to the source line of the resistive memory cell, and coupling the reference ground voltage to the bit of the resistive memory cell when a resetting operation being performed on the resistive memory cell.

2. The data writing method for the resistive memory cell as claimed in claim 1, wherein the step of providing the constant current generated by the constant current generator to the bit line of the resistive memory cell, and coupling the reference ground voltage to the source line of the resistive memory cell when the forming or setting operation being performed on the resistive memory cell; and providing the constant current to the source line of the resistive memory cell, and coupling the reference ground voltage to the bit of the resistive memory cell when the resetting operation being performed on the resistive memory cell comprises:

in a first time interval, providing the constant current to one of the bit line and the source line of the resistive memory cell, and coupling the reference ground voltage to another one of the bit line and the source line.

3. The data writing method for the resistive memory cell as claimed in claim 2, wherein after the step of providing the constant current to one of the bit line and the source line of the resistive memory cell, and coupling the reference ground voltage to another one of the bit line and the source line, the data writing method further comprises:

stopping providing the constant current to the resistive memory cell; and in a second time interval, coupling the source line to the reference ground voltage, and providing a read voltage to the bit line to perform a read operation of a resistance value of the resistive memory cell.

4. The data writing method for the resistive memory cell as claimed in claim 3, wherein after the step of in the second time interval, coupling the source line to the reference ground voltage, and providing the read voltage to the bit line to perform the read operation of the resistance value of the resistive memory cell, the data writing method further comprises:

determining whether the resistance value of the resistive memory cell falls within a predetermined range, wherein when the resistance value of the resistive memory cell does not fall within the predetermined range, the step of providing the constant current to one of the bit line and the source line of the resistive memory cell, and coupling the reference ground voltage to another one of the bit line and the source line is repeated.

5. A resistive memory, comprising:

a plurality of resistive memory cells;

a word line signal providing circuit, coupled to word lines of the resistive memory cells, and providing a word line voltage according to a column address signal to the word line of a selected resistive memory cell corresponding to the column address signal;

a bit line signal providing circuit, coupled to bit lines of the resistive memory cells, providing a reference ground voltage to the bit line of the selected resistive memory cell according to a row address signal when a resetting operation being performed on the selected resistive memory cell, and providing a constant current to the bit line of the selected resistive memory cell according to the row address signal when a setting or forming operation being performed on the selected resistive memory cell;

a source line signal providing circuit, coupled to source lines of the resistive memory cells, providing the constant current to the source lines of the resistive memory cell when the resetting operation being performed on the selected resistive memory cell, and providing the reference ground voltage to the source line of the selected resistive memory cell according to the row address signal when the setting or forming operation being performed on the selected resistive memory cell; and a constant current generator, coupled to the bit line signal providing circuit and the source line signal providing circuit, and configured to generate the constant current.

6. The resistive memory as claimed in claim 5, wherein the word line signal providing circuit comprises:

a word line voltage control circuit, providing the word line voltage; and a column address decoder, coupled to the word line voltage control circuit, and decoding the column address signal and providing the word line voltage to the word line of the selected resistive memory cell according to a decoded result.

7. The resistive memory as claimed in claim 5, wherein the bit line signal providing circuit comprises:

a control circuit, receiving the reference ground voltage or the constant current; and a row address decoding circuit, coupled to the control circuit, and decoding the row address signal to generate a decoded result, wherein the control circuit provides the reference ground voltage or the constant current to the row address decoding circuit according to an operation mode of the resistive memory, the row address decoding circuit provides the reference ground voltage or the constant current to the bit line of the selected resistive memory cell according to the decoded result.

8. The resistive memory as claimed in claim 7, wherein the operation mode is to perform the setting, resetting or forming operation on the resistive memory.

* * * * *